United States Patent [19]

Fourcroy et al.

[11] Patent Number: 5,029,272
[45] Date of Patent: Jul. 2, 1991

[54] INPUT/OUTPUT CIRCUIT WITH PROGRAMMABLE INPUT SENSING TIME

[75] Inventors: Antone L. Fourcroy; Mark W. McDermott; James C. Smallwood, all of Austin, Tex.

[73] Assignee: Motorola, Inc., Schaumburg, Ill.

[21] Appl. No.: 431,057

[22] Filed: Nov. 3, 1989

[51] Int. Cl.$^5$ .................... H03K 5/153; H03K 5/135
[52] U.S. Cl. .................... 307/518; 307/234; 307/352; 377/39
[58] Field of Search ............. 307/234, 352, 517, 518; 328/109, 110; 377/12, 16, 39, 118, 130

[56] References Cited

U.S. PATENT DOCUMENTS

| | | | |
|---|---|---|---|
| 4,498,176 | 2/1985 | Wagner | 371/47 |
| 4,566,111 | 1/1986 | Tanagawa | 377/39 |
| 4,617,480 | 10/1986 | Au | 307/480 |
| 4,692,710 | 9/1987 | Shvartsman | 307/234 |
| 4,710,721 | 12/1987 | Camus | 307/518 |
| 4,756,013 | 7/1988 | Van Veldhuizen | 377/39 |

Primary Examiner—John Zazworsky
Attorney, Agent, or Firm—Paul J. Polansky

[57] ABSTRACT

An input/output circuit of an integrated circuit with a programmable input sensing time. The output driver of the input/output circuit is open drain and is designed for use in a wire-OR configuration with other devices. The input/output circuit is coupled to a bonding pad and through the bonding pad to a device pin, and counts a programmable number of clock cycles between a negation of an output drive signal and when the state of the pin is sampled as an input. Since different applications use a wide range of values for external pullup resistors, the input/output circuit allows adjustment of the sample time to fit a particular application.

10 Claims, 1 Drawing Sheet

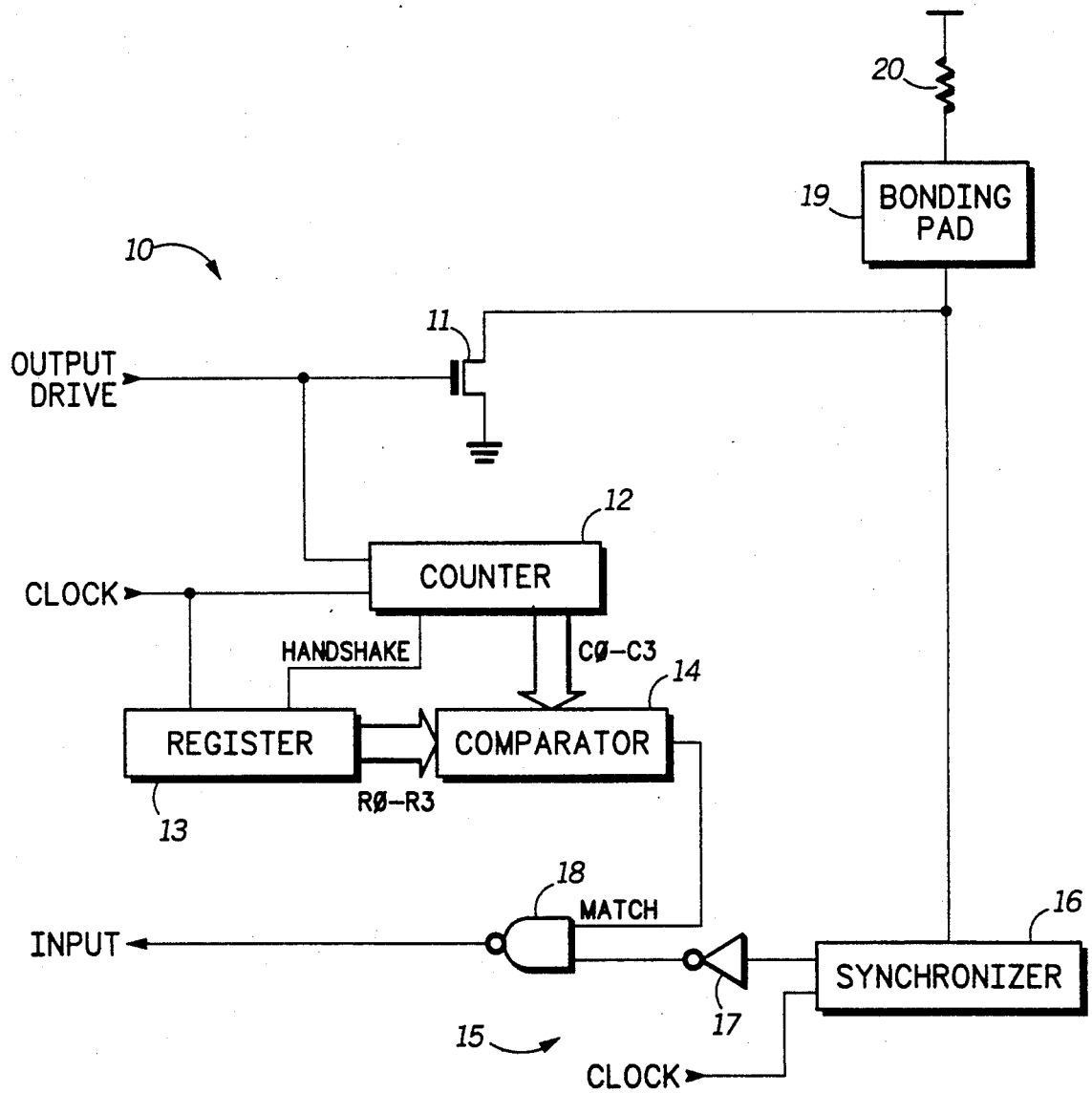
*FIGURE*

INPUT/OUTPUT CIRCUIT WITH PROGRAMMABLE INPUT SENSING TIME

FIELD OF THE INVENTION

This invention relates generally to input/output circuits, and more particularly, to input/output circuits in integrated circuits with open drain output drivers.

BACKGROUND OF THE INVENTION

Some integrated circuit devices such as microprocessors or microcontroller units (MCUs) require signals which provide bidirectional information, such as handshaking, between one or more such devices which may be present in a system. These signals are output signals to the device at certain points in time, and subsequently become input signals. The output buffers providing these input/output signals are also typically open drain. Open drain output buffers allow multiple devices in a system to be connected in a wire-OR fashion. The output driver is typically an N-channel MOS transistor whose drain provides the output signal and whose source is connected to a negative power supply voltage terminal $V_{ss}$, approximately 0 volts.

A problem arises with such an input/output circuit in certain applications, especially MCU applications. When an MCU drives and then negates the signal, the voltage of the wire-OR signal must rise to an appropriate level before it is sampled by the MCU. In order to minimize power consumption, a large-valued pullup resistor may be used. However the large-valued resistor makes an associate RC time constant large, and when the MCU samples the signal it may still be seen as a logic low. On the other hand, some applications where speed is critical require the signal to be sampled quickly and can tolerated smaller-valued resistors in order to pull up the signal faster. When to sample the signal as an input thus presents comflicts between different applications.

BRIEF DESCRIPTION OF THE INVENTION

Accordingly, it is an object of the present invention to provide an input/output circuit that samples a signal a programmable amount of time after the integrated circuit negates the signal.

It is another object of the present invention to provide a method for sampling a logic state of an input/output signal on a bonding pad of an integrated circuit after a negation of the signal by an open drain output driver of the integrated circuit.

It is yet another object of the present invention to provide a method for setting an initial time to sample a logic state on a bonding pad after a negation of an output signal.

In carrying out these and other subjects of the invention, there is provided, in one form, an input/output circuit of an integrated circuit with an open drain output, the input/output circuit coupled to a bonding pad, the output driver coupling the bonding pad to a power supply voltage terminal in response to an output drive signal, comprising a counter portion, a register portion, a comparator portion, and a logic portion. The counter portion receives the output drive signal and a clock signal, and counts a number of clock cycles of the clock signal after a negation of the output drive signal. The register portion stores a predetermined value equal to a number of clock periods between the negation of the output drive signal and when a logic state on the bonding pad is to be sampled. The comparator portion is coupled to the counter portion and to the register portion, and compares the number of clock periods after thre negation of the clock signal to the predetermined value. The logic portion is coupled to the comparator portion and to the bonding pad and provides an input signal corresponding to the logic state when the number of clocks equals the predetermined value.

These and other objects, features and advantages will be more clearly understood from the following detailed description taken in conjuction with the accompanying drawing.

BRIEF DESCRIPTION OF THE DRAWINGS

The sole FIGURE illustrates in partial block diagram form and partial schematic form an input/output buffer circuit in accordance with a preferred embodiment of the present invention.

DETAILED DESCRIPTION OF THE INVENTION

The sole FIGURE shows an input/output circuit 10 in accordance with a preferred embodiment of the present invention. Circuit 10 comprises an N-channel transistor 11, a counter 12, a register 13, a comparator 14, a logic portion 15 comprising a synchronizer 16, an inverter 17, and an NAND gate 18, and a bonding pad 19. Also shown in the FIGURE is a resistor 20 which is external to an integrated circuit of which circuit 10 is part.

Trasistor 11 has a drain coupled to bonding pad 19 and providing an input/output signal thereon, a gate for receiving a signal OUTPUT DRIVE, and a source connected to a power supply voltage terminal $V_{ss}$. $V_{ss}$ is a negative power supply votage terminal and is approximately 0 volts. Counter 12 recievives OUTPUT DRIVE, a clock signal CLOCK, and provides a signal HANDSHAKE and four output signal C0, C1, C2, and C3. Register 13 receives CLOCK and HANDSHAKE, and provides four register signals R0, R1, R2, and R3. In a preferred embodiment output driver 10 is part of an MCU and R0, R1, R2, R3 are provided to register 13 through an internal data bus. Upon reset, register 13 is loaded with an initial value. Comparator 14 is coupled to counter 12 and receives signals C0-C3 therefrom, and to register 13 and receives signals R0-R3 therefrom. Comparator 14 provides a signal MATCH as an output. In logic portion 15, synchronizer 16 is coupled to bonding pad 19 and receives CLOCK, and provides a synchronized input signal as an output. Inverter 17 has an input terminal for receiving the synchronized input signal, and an output terminal. NAND gate 18 has a first input terminal for receiving MATCH, a second input terminal connected to the output terminal of inverter 17, and an output terminal providing a signal INPUT. INPUT is an output signal of NAND gate 18, and an input signal of the integrated circuit. INPUT is equal to a logic state of the input/output signal on bonding pad 19 when circuit 10 is sampling the input/output signal. Resistor 20 is not a part of circuit 10 or the integrated circuit, but is coupled to bonding pad 19 through a pin of the integrated circuit's package and through a bonding wire connecting bonding pad 19 to the integrated circuit's package.

In operation, circuit 10 provides a signal on bonding pad 19 through an open drain output driver when providing an output as a logic low and receives and synchronizes the input/output signal on bonding pad 19 when receiving an input. When providing the output, OUTPUT DRIVE is asserted, transistor 11 is conductive, and bonding pad 19 is substantially coupled to $V_{ss}$. When OUTPUT DRIVE is negated, transistor 11 is made nonconductive, and bonding pad 19 is not driven by the integrated circuit. In this case, resistor 20 pulls up the voltage on bonding pad 19, so that other devices in the system see the input/output signal as a logic high.

When OUTPUT DRIVE negated, counter 12 begins counting the number of clock periods that elapse. Counter 12 is preferably a 4-bit polynomial counter, which provides four output signals and is able to count from 1 to 15. In a polynomial counter, the zero state is undefined, so that counter 12 effectively counts 15 states. Counter 12 outputs C0–C3 to indicate the value of the count. Comparator 14 then compares this value with the contents of register 13, R0–R3. When C0–C3 equal R0–R3, comparator 14 outputs MATCH. It should be apparent that different-sized registers and counters could be used as well.

When MATCH is negated, the output of NAND gate 18 is always high. When MATCH is asserted, however, the output of NAND gate 18 is determined by the output of inverter 17. The output of inverter 17 in turn is an inverted, sychronized value representing the logic state on bonding pad 19. Sychronizer 16 receives a voltage on bonding pad 19 and latches it on a falling edge of CLOCK. Then it provides the sychronized input signal on a rising edge of CLOCK. Which clock edge to use may be varied depending on the application. Synchronizers which can be used as synchronizer 16 is taught by Wagner in U.S. No. 4,498,176 entitled "A Method and Apparatus for the Error-Free Synchronization of Asynchronous Pulses", and by Au in U.S. Pat. No. 4,617,480 entitled "High Speed Sychronizer which Minimizes Circuitry". The output of NAND gate 18, when MATCH is high on the first input terminal of NAND gate 18, is equal to the complement of the logic state on the second input terminal. Therefore, the signal on bonding pad 19 undergoes two inversions and the output of NAND gate 18 is a true signal with respect to the input/output signal.

In the preferred embodiment, the contents of register 13 are provided on the internal data bus by a CPU of the MCU. Other embodiments, such as a read-only-memory (ROM) could also be used. Therefore, software provides the contents of register 13. Register 13 is implemented as a pair of buffers. When register 13 is programmed, four bits are taken from an internal data bus and stored in the first buffer. Then, when HANDSHAKE is asserted, the contents of the first buffer are loaded into the second buffer, where they are driven as R0–R3 into comparator 14. HANDSHAKE signals that C0–C3 are stable so that the second buffer in register 13 may drive R0–R3 into comparator 14 without contention. While such a two-buffer register scheme may be implemented differently, register 13 must prevent contention in comparator 14.

Additionally, a simple state machine can be used to calibrate the sample time of circuit 10. The sample time could be loaded into register 13 after the calibration is complete. The calibrated sample time is then used as an initial value of register 13 until reprogrammed by software. To implemented such a calibration, first output drive is asserted during a calibration period. Then, OUTPUT DRIVE is negated and a counter begins to count. Thereafter, on every clock cycle, a logic state of input is sampled, and when sampled in a logic high state, the calibration is complete. The value of the counter is transferred to the register. It should be apparent that other methods of calibrating an initial value for register 13 are also possible.

By now it should be apparent that an input/output circuit that allows an input sample time after negation of an output signal to be programmed for optimization for a particular application has been described. In addition to describing a circuit providing a programmable input sample time, a method of calibrating an initial value for the sample time, which can be implemented in a finite state machine, has been described.

While the invention has been described in the context of a preferred embodiment, it will be apparent to those skilled in the art that the present invention may be modified in numerous ways and may assume many embodiments other than that specifically set out and described above. According, it is intended to included within the invention all such modifications which fall within the scope of the appended claims.

We claim:

1. An input/output circuit of an integrated circuit comprising:
   an open drain output driver responsive to an output drive signal;
   counter means, for receiving said output drive signal and a clock signal, and for counting a number of cycles of said clock signal in response to a negation of said output drive signal;
   register means, for storing a predetermined value, said predetermined value equal to a number of clock cycles between said negation of said output drive signal and when a logic state at said open drain output driver is to be sampled;
   comparator means, coupled to said counter means and to said register means, for comparing said number of clock cycles after said negation of said output drive signal to said predetermined value; and
   logic means, coupled to said comparator means and to said open drain output driver, for providing an input signal corresponding to said logic state when said number of clock cycles equals said predetermined value.

2. An input/output circuit of an integrated circuit comprising:
   a bonding pad, for providing an output signal out of the integrated circuit;
   an output driver, coupled to said bonding pad, for coupling said bonding pad to a power supply voltage terminal in response to an output drive signal;
   counter means, for receiving said output drive signal and a clock signal, and for counting a number of cycles of said clock signal after negation of said output drive signal;
   register means, for storing a predetermined value, said predetermined value equal to a number of clock cycles between said negation of said output drive signal and when a logic state on said bonding pad is to be sampled;
   comparator means, coupled to said counter means and to said register means, for comparing said number of clock cycles after said negation of said clock signal to said predetermined value; and
   logic means, coupled to said comparator means and to said bonding pad, for providing an input signal corresponding to a logic state on said bonding pad when said number of clock cycles equals said predetermined value.

3. The input/output circuit of claim 2, wherein said output signal either is provided as a logic low or is not driven by said output driver.

4. The input/output circuit of claim 2, wherein said output driver comprises a transistor having a first current electrode coupled to said bonding pad, a control electrode for receiving said output drive signal, and a second current electrode coupled to said power supply voltage terminal.

5. The input/output circuit of claim 2, wherein said counter is a four bit polynomial counter, and wherein said register stores four bits.

6. the input/output circuit of claim 2 wherein said logic means further comprises:
   a synchronizer coupled to said bonding pad, for providing an output signal indicating a logic state of said bonding pad in response to a predetermined transition of said clock signal;
   an inverter having an input terminal for receiving said output signal of said sychronizer, and an output terminal; and
   a NAND gate having a first input terminal coupled to said comparator, a second input terminal coupled to said output terminal of said inverter, and an output terminal for providing said output signal.

7. A method for sampling a logic state of an input/output signal on a bonding pad of an integrated circuit after a negation of the signal by an open drain output driver of the integrated circuit, comprising the steps of:
   counting a time the negation of the open drain output driver;
   comparing said time with a predetermined value; and
   sampling the logic state on the bonding pad when said time reaches said predetermined value.

8. The method of claim 7, further comprising the step of:
   calibrating the input/output signal to provide an initial value of said predetermined value.

9. The method of claim 8 wherein said step of calibrating comprises the steps of:
   providing an output drive signal to the open drain output driver during a calibration period;
   negating said output drive signal; sampling the logic state after each clock period; counting a number of said clock periods until said logic state is in a given state; and
   storing said number as said predetermined value when the logic state is in a given state.

10. the method of claim 9 wherein said given state is equal to a logic high state.

* * * * *

UNITED STATES PATENT AND TRADEMARK OFFICE
CERTIFICATE OF CORRECTION

PATENT NO. : 5,029,272

DATED : 07/02/91

INVENTOR(S) : Antone L. Fourcroy et al

It is certified that error appears in the above-identified patent and that said Letters Patent is hereby corrected as shown below:

```
Column 4, line 54, after "after", insert --a--.
Column 5, line 15, change "the", to --The--.
Column 5, line 22, change "sychronizer", to --synchronizer--.
Column 6, line 3, after "input", delete "-".
Column 6, line 7, after "time", insert --from--.
Column 6, line 26, change "the", to --The--.
```

Signed and Sealed this

Thirteenth Day of October, 1992

Attest:

DOUGLAS B. COMER

Attesting Officer

Acting Commissioner of Patents and Trademarks